(12) United States Patent
Kinoshita et al.

(10) Patent No.: US 12,517,552 B2
(45) Date of Patent: Jan. 6, 2026

(54) ELECTRONIC APPARATUS INCLUDING BEZEL AND DOUBLE SIDED TAPES

(71) Applicant: Lenovo (Singapore) Pte. Ltd., Singapore (SG)

(72) Inventors: Hiroaki Kinoshita, Kanagawa (JP); Takehito Yamauchi, Kanagawa (JP); Shigehiro Horiuchi, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 206 days.

(21) Appl. No.: 18/219,346

(22) Filed: Jul. 7, 2023

(65) Prior Publication Data

US 2024/0045472 A1    Feb. 8, 2024

(30) Foreign Application Priority Data

Aug. 3, 2022    (JP) ................................. 2022-123971

(51) Int. Cl.
    *G06F 1/16*    (2006.01)
(52) U.S. Cl.
    CPC .......... *G06F 1/1652* (2013.01); *G06F 1/1616* (2013.01); *G06F 1/1681* (2013.01)
(58) Field of Classification Search
    CPC .... G06F 1/1652; G06F 1/1616; G06F 1/1681; G06F 1/1686; G06F 1/1637; G06F 1/1626; H04M 1/0268; H04M 1/022
    See application file for complete search history.

(56) References Cited

U.S. PATENT DOCUMENTS

| | | | |
|---|---|---|---|
| 11,029,788 B2* | 6/2021 | Park ...................... | G06F 3/0416 |
| 2015/0062525 A1* | 3/2015 | Hirakata ............... | G06F 1/1641 |
| | | | 349/158 |
| 2016/0262273 A1* | 9/2016 | Fujita .................... | G02F 1/1341 |
| 2019/0146556 A1* | 5/2019 | Mizoguchi ............ | G06F 1/1681 |
| | | | 361/679.27 |
| 2020/0043382 A1* | 2/2020 | Isa ........................ | G06F 1/1626 |
| 2020/0249723 A1* | 8/2020 | Mizoguchi ............ | G06F 1/1626 |

FOREIGN PATENT DOCUMENTS

| | | | |
|---|---|---|---|
| CN | 110909721 A  * | 3/2020 | ............. G06V 40/13 |
| JP | 2014-032587 A | 2/2014 | |
| JP | 2020-120319 A | 8/2020 | |
| JP | 2021-033776 A | 3/2021 | |
| JP | 6950044 B1 | 10/2021 | |
| KR | 102329083 B1 * | 11/2021 | |

* cited by examiner

*Primary Examiner* — Abhishek M Rathod
(74) *Attorney, Agent, or Firm* — Osha Bergman Watanabe & Burton LLP

(57) ABSTRACT

An electronic apparatus includes: a chassis member that has a standing wall; a display that is supported by the chassis member and has an outer peripheral edge portion surrounded by the standing wall; a control board that is connected to the display and controls display of the display; and a bezel member that is provided so as to straddle between the standing wall and the display, and is adhesively fixed to front surfaces of the standing wall and the display. A folded portion is provided between the display and the control board and is folded back to a back side of the display so as to wrap around one side of the outer peripheral edge portion of the display.

8 Claims, 11 Drawing Sheets

ELECTRONIC APPARATUS INCLUDING BEZEL AND DOUBLE SIDED TAPES

CROSS-REFERENCE TO RELATED APPLICATIONS

This application claims priority to Japanese Patent Application No. 2022-123971 filed on Aug. 3, 2022, the contents of which are hereby incorporated herein by reference in its entirety.

BACKGROUND

Technical Field

The present invention relates to an electronic apparatus including a display.

Description of Related Art

In an electronic apparatus, there is a configuration in which a display and a control board thereof are connected using a flexible board (see Patent Japanese Patent Publication No. 6950044).

In the configuration of Japanese Patent Publication No. 6950044 described above, a bezel member that straddles between the display and a standing wall forming an outer edge of a chassis member is provided. The rear surface of the bezel member is adhesively fixed to the front surface of the display and the standing wall thereof via double-sided tape. Therefore, the double-sided tape for fixing the bezel member also adheres to a connecting portion (ACF bonding) between the display and the flexible board. As a result, in the configuration, when the display is removed for maintenance or the like and the bezel member is peeled off, there is a problem in that the ACF bonding is destroyed and the display that does not need to be replaced is destroyed.

SUMMARY

One or more embodiments of the present invention provide an electronic apparatus capable of stably fixing a bezel member and suppressing a display from being destroyed when maintenance is performed.

An electronic apparatus according to the first aspect of the present invention includes a chassis member that has a standing wall; a display that is supported by the chassis member and has an outer peripheral edge portion surrounded by the standing wall; a control board that is connected to the display and controls display of the display; and a bezel member that is provided so as to straddle between the standing wall and the display, and is adhesively fixed to front surfaces of the standing wall and the display, in which a folded portion is provided between the display and the control board and is folded back to a back side of the display so as to wrap around one side of the outer peripheral edge portion of the display, and, in a portion along the one side provided with the folded portion, the bezel member adheres to the standing wall with a first double-sided tape,
  adheres to the front surface of the display with a second double-sided tape, and is provided with a non-adhesive region at a position vertically overlapping the folded portion between the first double-sided tape and the second double-sided tape.

The above-described aspect of present invention can stably fix a bezel member and suppress a display from being destroyed when maintenance is performed.

DETAILED DESCRIPTION

An electronic apparatus according to the present invention will be described in detail below with preferred embodiments with reference to the accompanying drawings.

Figure 1:
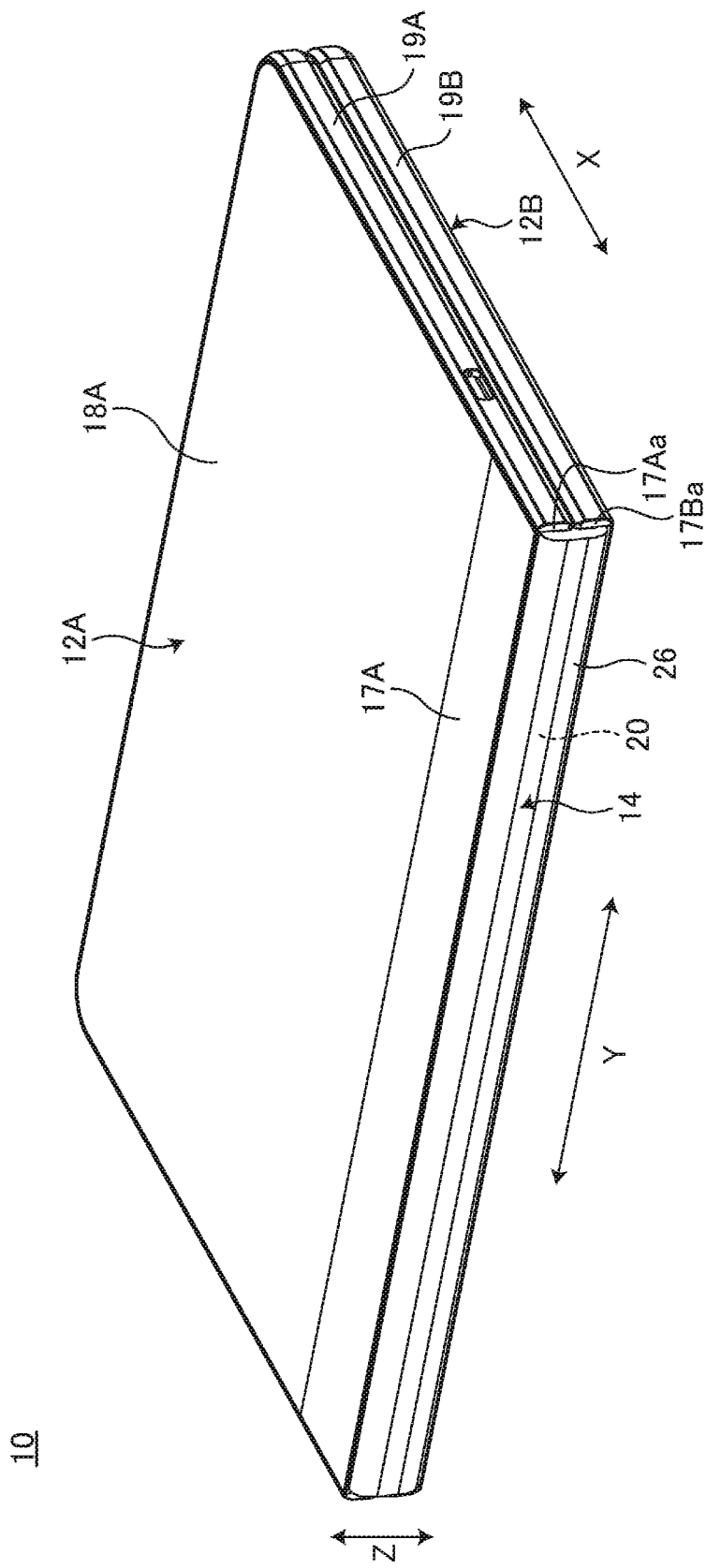
FIG. 1 is a perspective view schematically illustrating a state in which an electronic apparatus according to an embodiment is closed and in a 0-degree posture.
Figure 2:
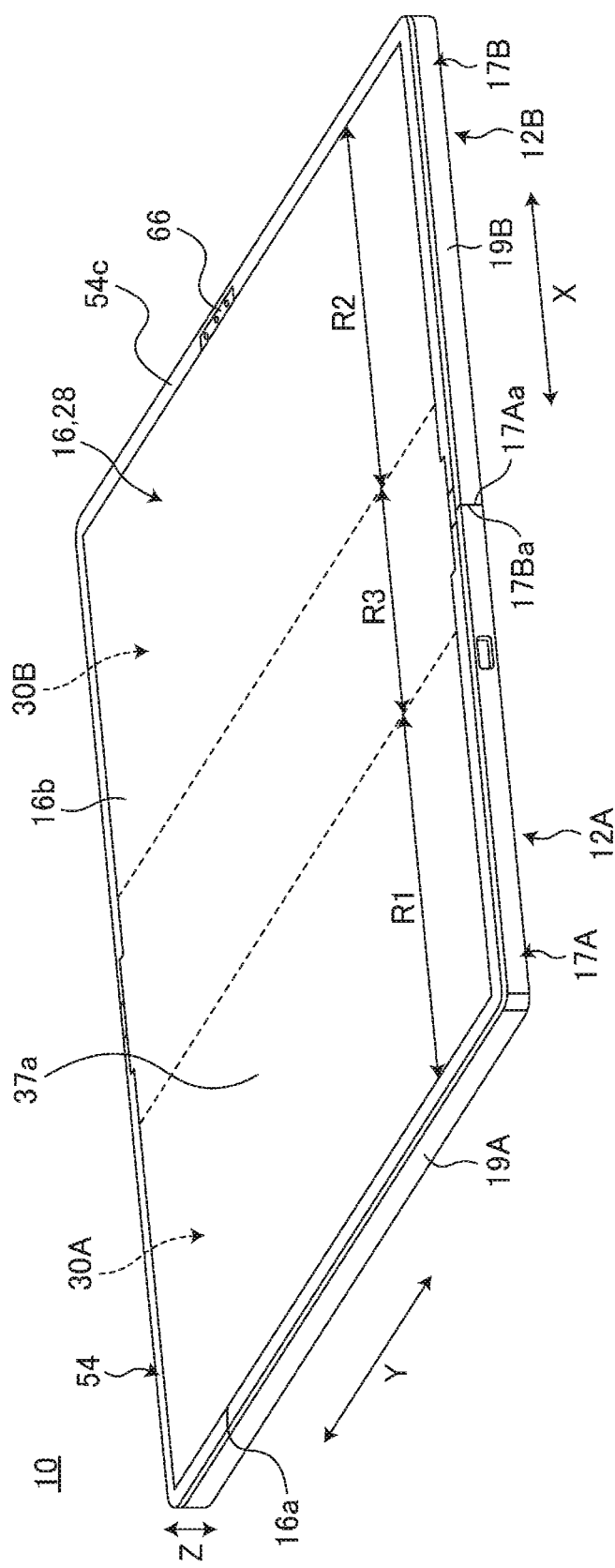
FIG. 2 is a perspective view schematically illustrating a state in which the electronic apparatus illustrated in FIG. 1 is opened and in a 180-degree posture.
Figure 3:
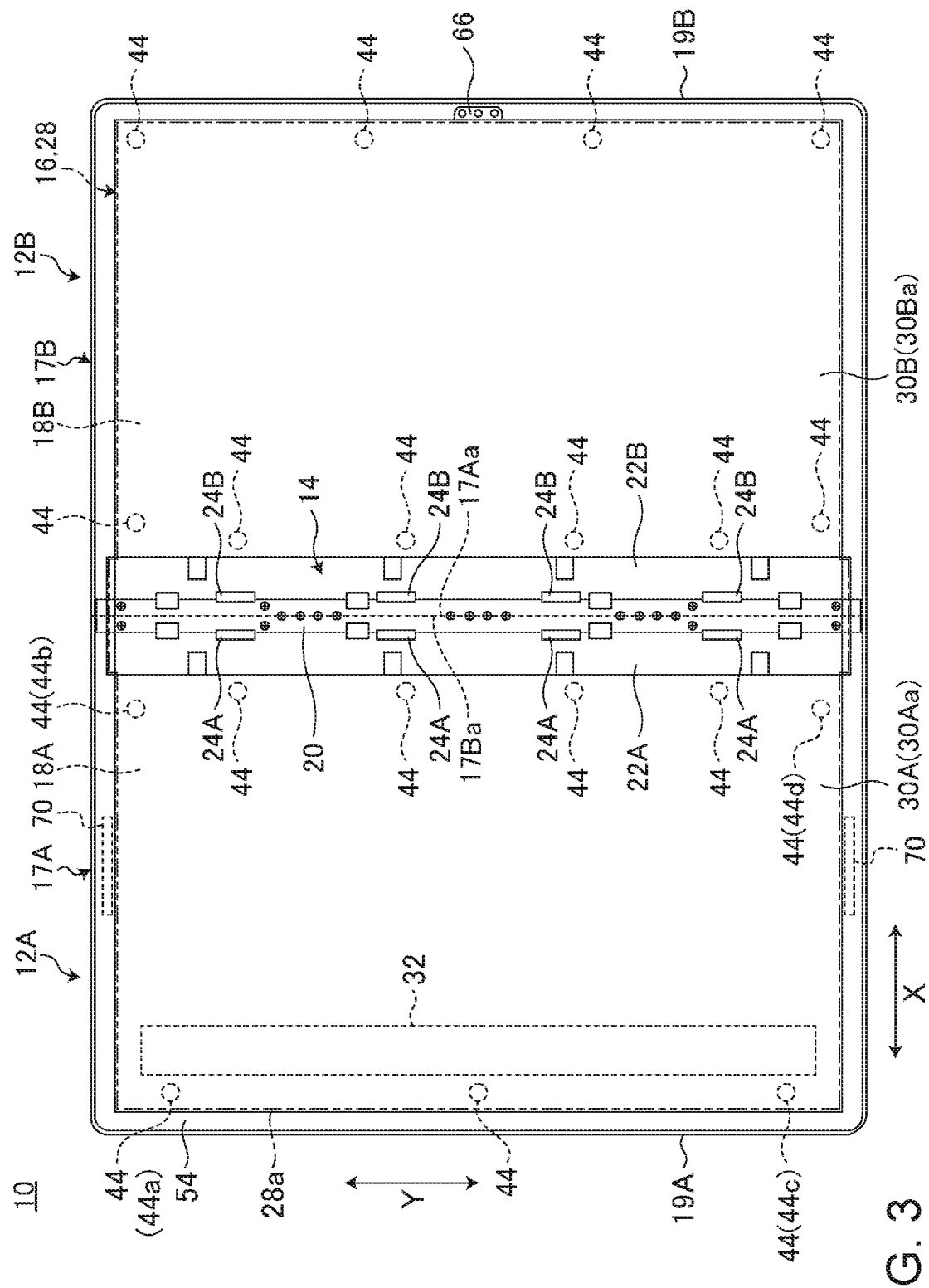
FIG. 3 is a plan view schematically illustrating an internal structure of the electronic apparatus illustrated in FIG. 2.

FIG. 1 is a perspective view schematically illustrating a state in which an electronic apparatus 10 according to an embodiment is closed and in a 0-degree posture. FIG. 2 is a perspective view schematically illustrating a state in which the electronic apparatus 10 illustrated in FIG. 1 is opened and in a 180-degree posture. FIG. 3 is a plan view schematically illustrating an internal structure of the electronic apparatus 10 illustrated in FIG. 2.

As illustrated in FIGS. 1 to 3, the electronic apparatus 10 includes a first chassis member 12A and a second chassis member 12B, a hinge device 14, and a display 16. The electronic apparatus 10 of the present embodiment exemplifies a tablet PC or a laptop PC that is capable of being folded like a book. The electronic apparatus 10 may be a smartphone, a portable game machine, or the like.

Each of the chassis members 12A and 12B is disposed adjacent to each other. The first chassis member 12A includes a first frame member 17A and a first rear surface plate 18A. The first frame member 17A is a rectangular frame-shaped member having standing walls 19A formed on three sides other than the edge portion 17Aa adjacent to the second chassis member 12B. The first rear surface plate 18A is a plate-shaped member that closes the rear surface opening of the first frame member 17A (see also FIG. 6). Similarly, the second chassis member 12B includes a second frame member 17B that has standing walls 19B formed on three sides other than the edge portion 17Ba adjacent to the first chassis member 12A, and a second rear surface plate 18B that closes the rear surface opening of the second frame member 17B. Front surface openings of the frame members 17A and 17B are closed with the display 16.

Each of the members 17A, 17B, 18A, and 18B is configured by, for example, a metal member such as stainless steel, magnesium, or aluminum, or a fiber-reinforced resin plate containing reinforcing fibers such as carbon fiber, and the like.

A hinge device 14 connects the chassis members 12A and 12B so as to be relatively rotatable. The hinge device 14 also functions as a rear cover that hides the gap between the edge portions 17Aa and 17Ba formed in the 0-degree posture illustrated in FIG. 1. The display 16 extends over the chassis members 12A and 12B.

Hereinafter, as for the electronic apparatus 10, description is performed while the direction in which the chassis members 12A and 12B are arranged is called an X direction, the direction along the edge portions 17Aa and 17Ba orthogonal to the X direction is called a Y direction, and the thickness direction of the chassis members 12A and 12B is called a Z direction. As for the angular posture between the chassis members 12A and 12B, description is performed while a state in which the chassis members 12A and 12B are laminated so as to overlap each other in the surface normal direction is called the 0-degree posture (see FIG. 1), and a state in which the chassis members 12A and 12B are aligned to each other in a direction perpendicular to the surface normal direction (X direction) is called the 180-degree posture (see FIG. 2). It is possible to call the posture between 0 and 180 degrees by appropriately carving the angle. For example, a state in which the surface normal directions of the chassis members 12A and 12B are orthogonal to each other is a 90-degree posture. These angles are for convenience of description, and the actual product may of course have angular positions slightly deviated from the exact angular positions indicated by angle numbers.

As illustrated in FIG. 3, the hinge device 14 of the present embodiment has a hinge main body 20, support plates 22A and 22B, and a plurality of link arms 24A and 24B.

The hinge main body 20 is provided at a position straddling the edge portions 17Aa and 17Ba of the chassis members 12A and 12B, and extends over the substantially entire length in the Y direction along the edge portions 17Aa and 17Ba. The hinge main body 20 is a block-shaped component formed of a metal material such as aluminum. The hinge main body 20 supports two hinge shafts aligned in the X direction in the 180-degree posture. A plurality of link arms 24A aligned in the Y direction are pivotally supported on one hinge shaft, and a plurality of link arms 24B aligned in the Y direction are pivotally supported on the other hinge shaft. Each link arm 24A is pivotally supported by a bracket fixed to the first frame member 17A. Each link arm 24B is pivotally supported by a bracket fixed to the second frame member 17B.

As a result, the hinge main body 20 connects the chassis members 12A and 12B so as to be relatively rotatable. A gear mechanism for synchronizing the rotational movement between the chassis members 12A and 12B, a torque mechanism for applying a predetermined rotational torque to the rotational movement between the chassis members 12A and 12B, and the like are also provided in the hinge main body 20. A rear cover component 26 serving as a decorative cover is attached to an outer surface of the hinge main body 20 (see FIG. 1).

The support plates 22A and 22B are plates that are formed of a metal material such as aluminum, extend in the Y direction, and have bilaterally symmetrical shapes. The support plates 22A and 22B are pivotally supported with respect to brackets, on which the link arms 24A are 24B are pivotally supported, thereby being swingable. The support plates 22A and 22B are aligned on the left and right sides of the hinge main body 20 in the 180-degree posture, and their front surfaces are disposed on the same plane as the front surface of the hinge main body 20. As a result, the hinge device 14 is capable of supporting a bending region R3 (see FIG. 2) of the display laminate 18, which will be described later, in the 180-degree posture.

Next, the configuration of the display 16 will be described.

Figure 4:
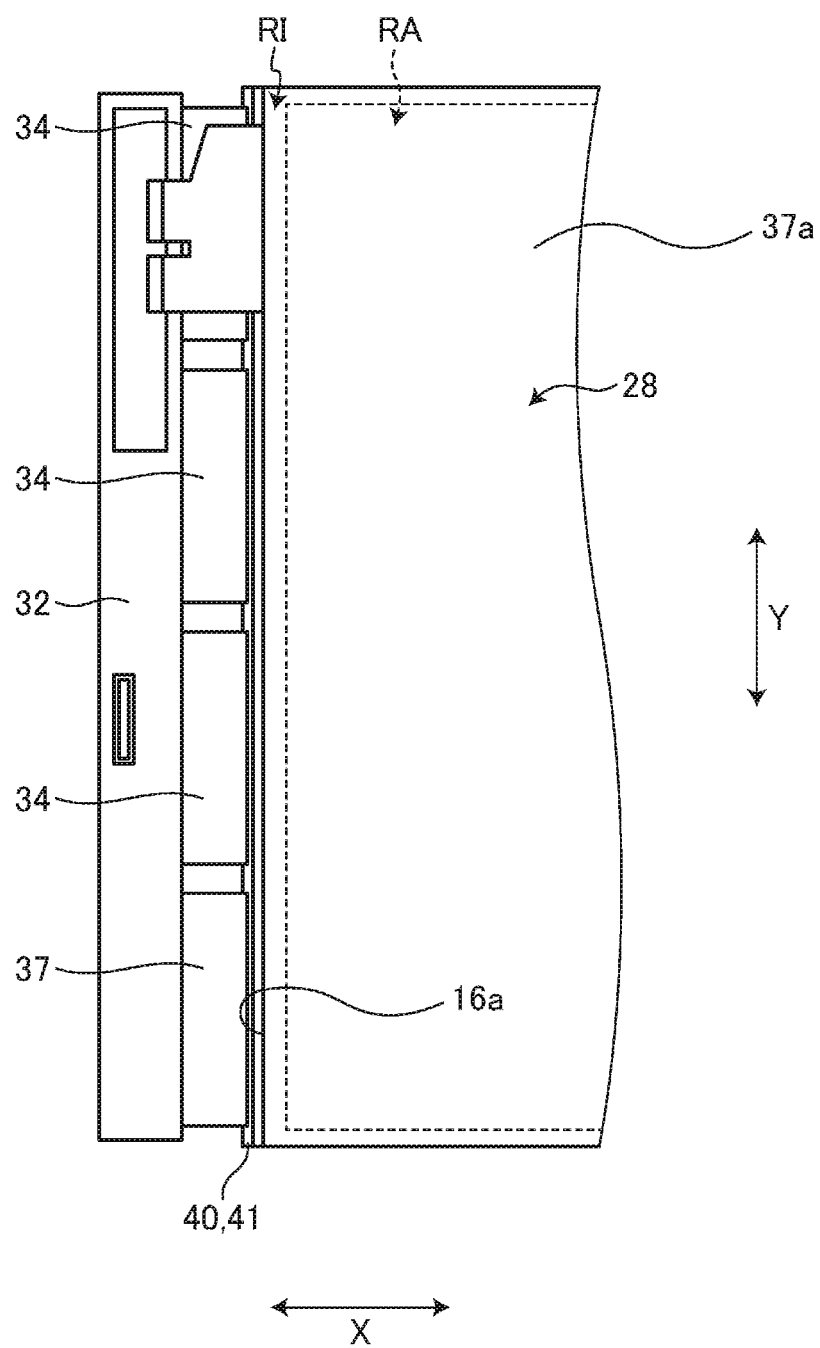
FIG. 4 is an enlarged plan view of one side of the display 16 and a peripheral portion thereof.
Figure 5:
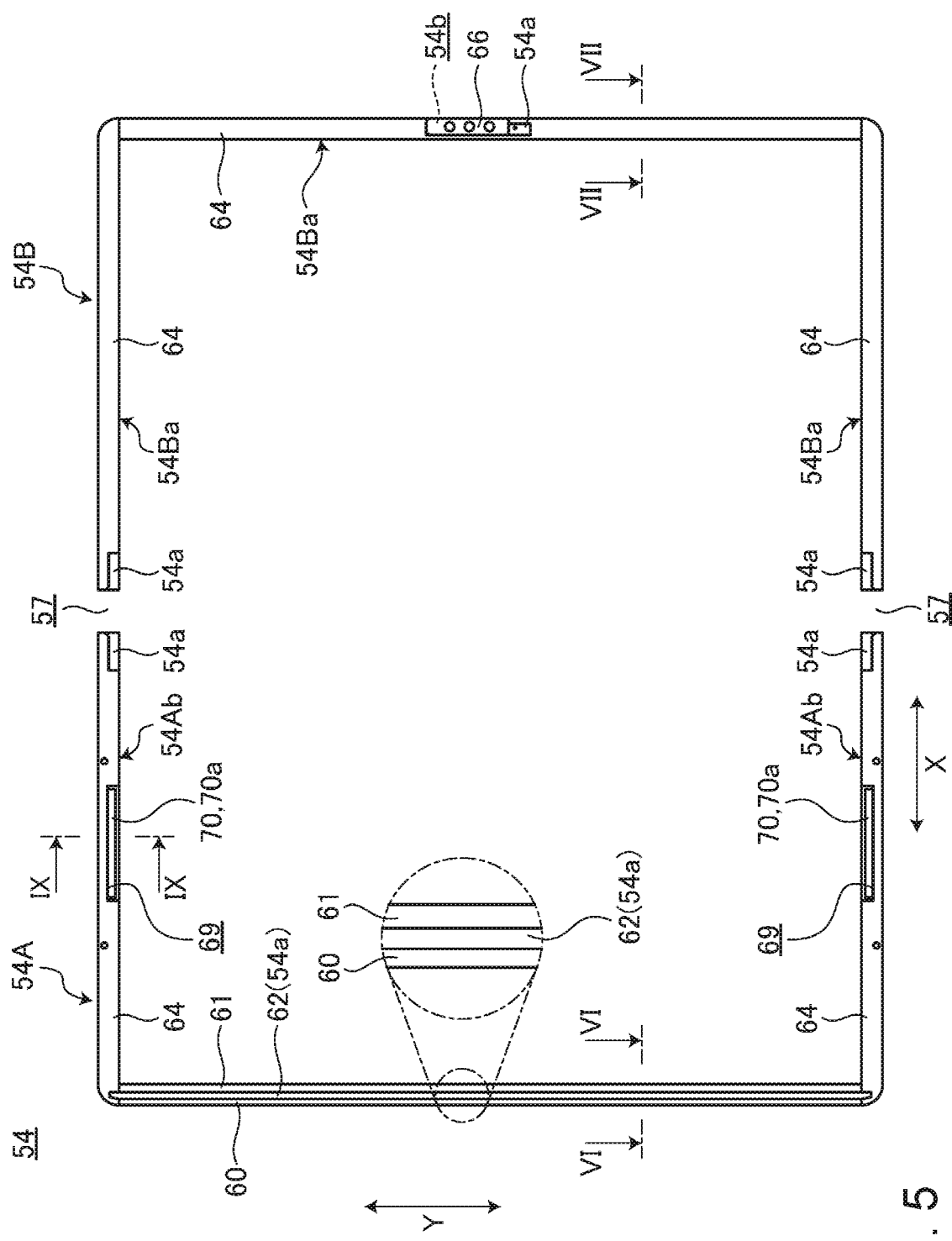
FIG. 5 is a bottom view of a bezel member that surrounds an outer peripheral edge portion of the display.
Figure 6:
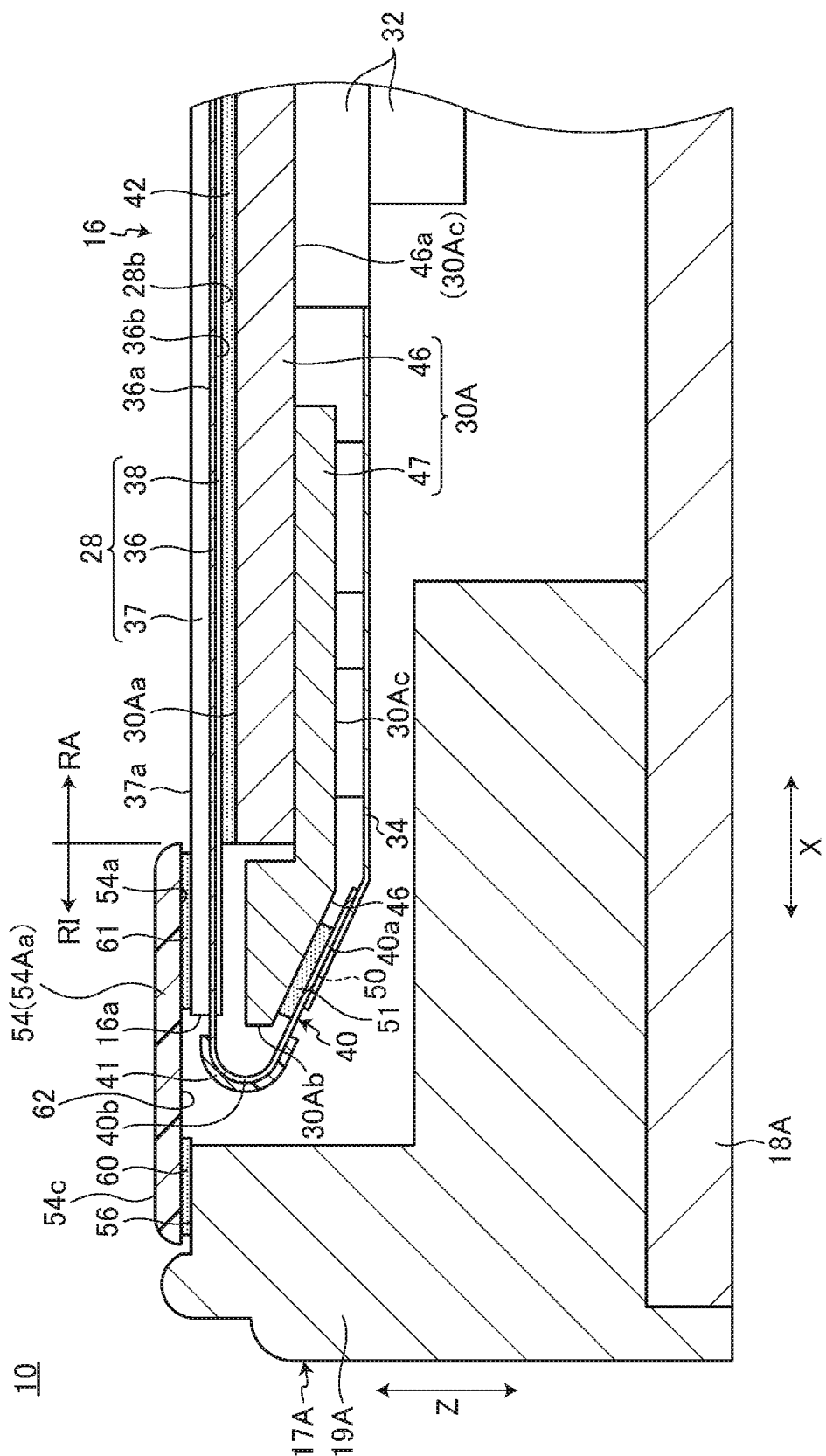
FIG. 6 is a schematic cross-sectional view taken along line VI-VI in FIG. 5.
Figure 7:
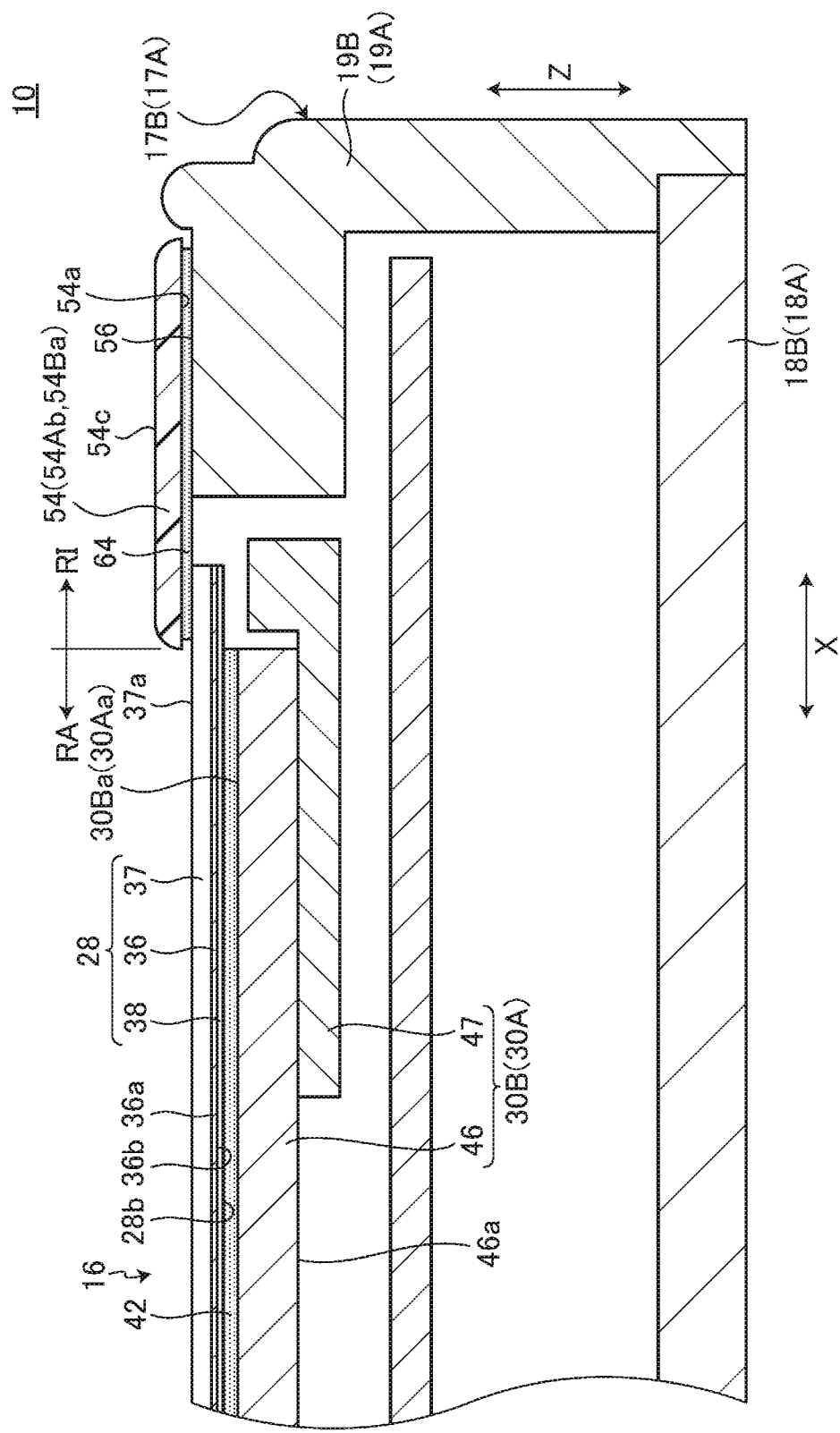
FIG. 7 is a schematic cross-sectional view along line VII-VII in FIG. 5.

FIG. 4 is an enlarged plan view of one side 16a of the display 16 and a peripheral portion thereof. FIG. 4 illustrates a state before the control board 32 is fixed to the first plate 30A. FIG. 5 is a bottom view of the bezel member 54 surrounding the outer peripheral edge portion of the display 16. FIG. 6 is a schematic cross-sectional view taken along line VI-VI in FIG. 5. FIG. 7 is a schematic cross-sectional view taken along line VII-VII in FIG. 5.

As illustrated in FIGS. 3, 4, and 6, the display 16 includes a display laminate 28, a first plate 30A, a second plate 30B, a control board 32, and four flexible boards 34. The display 16 of the present embodiment is configured as a display assembly in which each of the components is integrally assembled.

The display laminate 28 is formed in a flexible sheet shape as a whole. In the 0-degree posture illustrated in FIG. 1, the chassis members 12A and 12B are in a state of being folded in half and laminated on each other. At this time, the display laminate 28 is in a state in which a first region R1 on the side of the first chassis member 12A and a second region R2 on the side of the second chassis member 12B, which are illustrated in FIG. 2, are disposed so as to face each other, and the bending region R3, which is a boundary region between the regions R1 and R2, is bent in an arc shape. In the 180-degree posture illustrated in FIGS. 2 and 3, the chassis members 12A and 12B are aligned side by side with each other. At this time, the display laminate 28 has the regions R1 and R2 and the bending region R3 disposed to be aligned on the XY plane, and forms a flat plate shape as a whole.

As illustrated in FIGS. 6 and 7, the display laminate 28 is obtained by laminating a display body 36, a front surface sheet 37, and a rear surface sheet 38.

The display body 36 is, for example, a Plastic Organic Electro-Luminescence Diode (POLED). The display body 36 includes an active region RA and a non-active region RI surrounding the active region RA. The active region RA is a region for displaying an image, in which pixels disposed in a matrix shape are disposed. The non-active region RI is a region in which no image is displayed, and is provided so as to surround the active region RA. In the non-active region RI, for example, a wire, terminals, a driving circuit, and the like connected to the flexible board 34 are disposed.

A front surface sheet 37 is laminated on a front surface 36a of the display body 36. The front surface sheet 37 is, for example, a sheet in which a polarizing film is laminated under a functional film. A front surface 37a of the front surface sheet 37 configures the front surface of the display 16. The display laminate 28 of the present embodiment is a touch panel type. Therefore, the functional film configuring the front surface sheet 37 preferably has at least the anti-fingerprint functional layer. The front surface sheet 37 may further have an anti-glare function layer, an anti-reflection function layer, and the like. The display laminate 28 may not be of the touch panel type, but even in this case, the front surface sheet 37 preferably has the anti-fingerprint functional layer in order to suppress adhesion of fingertips.

A rear surface sheet 38 is laminated on a rear surface 36b of the display body 36. The rear surface sheet 38 is formed by forming a large number of hole portions in a metal sheet such as stainless steel. The rear surface sheet 38 has a certain degree of tension and is used to ensure the same radius of curvature as the design specifications when the display body 36 is bent. In FIGS. 6 and 7, cross-sectional hatching of the sheets 37 and 38 is omitted in order to ensure the visibility of the drawings.

As illustrated in FIGS. 4 and 6, the display body 36 has an extending part of the non-active region RI and has an extended portion 40 that protrudes on the side rather than the end surfaces of the sheets 37 and 38 laminated on the surfaces 36a and 36b. The extended portion 40 is provided on one side 16a of the four sides of the display 16 with respect to the standing wall 19A extending along the Y direction of the first frame member 17A.

An end portion 40a of the extended portion 40 is a part that is connected to each flexible board 34 and fixed to the first plate 30A. The extended portion 40 has a folded portion between the end portion 40a and the end surface of the display laminate 28 along one side 16a. The folded portion is a portion in which the display body 36 is folded back in an arc shape to a back side of the display 16 so as to wrap around one side 16a. A protective layer 41 for protecting the folded portion 40b is provided on the outer peripheral surface of the folded portion 40b. The protective layer 41 is, for example, an acrylic-based resin.

The folded portion 40b may be disposed on the side of the second chassis member 12B. However, it is necessary to prevent the folded portion 40b from being caught in the rotational movement of the chassis members 12A and 12B. For this reason, in the outer peripheral edge portion of the display 16, the folded portion 40b needs to be provided on a side other than the side along the X direction, which is the alignment direction of the chassis members 12A and 12B, that is, a side along the Y direction.

As illustrated in FIGS. 3, 6, and 7, the plates 30A and are disposed while interposing the hinge device 14 therebetween with a gap on the left and right, and the respective first surfaces 30Aa and 30Ba support the rear surface 28b of the display laminate 28. The rear surface 28b of the display laminate 28 has the first region R1 fixed to the first surface 30Aa of the first plate 30A and the second region R2 fixed to the first surface 30Ba of the second plate 30B. The regions R1 and R2 are fixed to the plates 30A and using an adhesive material 42 such as a double-sided tape. The first plate 30A is fastened to the first frame member 17A. The second plate 30B is fastened to the second frame member 17B. Reference numeral 44 in FIG. 3 indicates a fastening portion in which the plates 30A and 30B and the frame members 17A and 17B are screwed together.

The plates 30A and 30B are configured by a base plate 46 and a metal frame 47. The base plate 46 is, for example, a carbon fiber reinforced resin plate in which carbon fibers are impregnated with a matrix resin such as an epoxy resin. The metal frame 47 is formed of, for example, magnesium alloy or the like, and fixed to the outer peripheral edge portion of the rear surface 46a of the base plate 46. Since the plates 30A and 30B are carbon fiber reinforced resin plates, it is possible to ensure high flatness and to reduce the thickness and weight. However, the carbon fiber reinforced resin plate has a concern that the carbon fibers may fall off from the outer peripheral end surface (edge) in powder shapes, and shape processing and screw processing are also difficult. Therefore, the plates 30A and 30B are fixed to the metal frame 47 with an adhesive or the like so as to surround the outer peripheral end surface of the base plate 46 and the outer edge portion of the rear surface 46a. The base plate 46 may be formed of a metal material or a resin material instead of the carbon fiber reinforced resin plate. In this case, the metal frame 47 may be omitted.

The first plate 30A has an inclined surface 48. The inclined surface 48 is formed at a corner portion between an end surface 30Ab corresponding to one side 16a of the display 16 and a second surface 30Ac that is the rear surface of the first surface 30Aa which supports the display laminate 28. That is, the inclined surface 48 has a shape in which the edges of the end surface 30Ab and the second surface 30Ac are chamfered. The inclined surface 48 of the present embodiment is formed on a part of the metal frame 47 that protrudes outward from the base plate 46.

The control board 32 is a printed board for performing display control on the display 16, that is, display control on the display body 36, and various semiconductor chips are mounted thereon. As illustrated in FIG. 6, the control board 32 is fixed to the second surface 30Ac of the first plate 30A. The control board 32 is connected to the motherboard 49 (see FIG. 7) mounted inside the first chassis member 12A or the second chassis member 12B using flexible boards or the like.

As illustrated in FIGS. 4 and 6, the four flexible boards (Flexible Printed Circuits (FPC)) 34 are connected to the display body 36 and the control board 32. Each of the flexible boards 34 is aligned along the Y direction, which is the width direction of the extended portion 40 of the display body 36, with a gap therebetween.

Each of the flexible boards 34 is connected to the end portion 40a of the extended portion 40, thereby being connected to the display body 36. A connecting portion 50 between the flexible board 34 and the display body 36 is configured by electrical connection processing using, for example, an Anisotropic Conductive Film (ACF), so-called ACF bonding. Each of the flexible boards 34 is disposed so as to be hidden on a side of the second surface 30Ac of the first plate 30A by being connected to the end portion 40a at a tip of the folded portion 40b.

The connecting portion 50 is fixed to the inclined surface 48 of the first plate 30A by using the adhesive material 51. In the present embodiment, the end portion 40a of the extended portion 40 is fixed to the inclined surface 48 using the adhesive material 51, so that the connecting portion 50 is fixed to the inclined surface 48.

As illustrated in FIGS. 2, 6, and 7, the electronic apparatus 10 includes a bezel member 54 that surrounds an outer peripheral edge portion of the front surface 37a of the display 16.

Next, a configuration and an attachment structure of the bezel member 54 will be described.

As illustrated in FIGS. 3, 6, and 7, the bezel member 54 is provided so as to straddle between the standing walls 19A and 19B that stand upright on the side of the display 16 and the display 16, and covers the gap therebetween. The bezel member 54 is adhesively fixed to the upper end surfaces 56 of the standing walls 19A and 19B and the front surface 37a of the display 16, respectively.

As illustrated in FIG. 5, the bezel member 54 is a thin sheet-shaped member made of resin such as polycarbonate (PC), and has a frame shape along the outer peripheral edge portion of the display 16 as a whole. In the bezel member 54, a portion that passes the side of the hinge main body 20 in the X direction is divided by a pair of dividing portions 57 and 57. For this reason, the bezel member 54 of the present embodiment is configured by two U-shaped frame portions 54A and 54B that have corners at substantially right angles and face each other with the dividing portions 57 interposed therebetween, and surrounds most of the outer peripheral edge portion of the display 16. The dividing portion 57 is a relief portion for preventing the bezel member 54 from being damaged or bent when the hinge device 14 is operated. In a case where the bezel member 54 is made of flexible rubber or the like, the bezel member 54 may be formed in the shape of a rectangular frame as a whole without forming the dividing portion 57.

As illustrated in FIGS. 5 to 7, the bezel member 54 has a first portion 54Aa along one side 16a, on which the folded portion 40b is provided, of the display 16, and second portions 54Ab and 54Ba along three sides other than the one side 16a of the display 16. The first portion 54Aa is a side extending along the Y direction along one side 16a of the three U-shaped sides configuring the frame portion 54A. The second portion 54Ab includes two sides extending along the X direction other than the first portion 54Aa among the three U-shaped sides constituting the frame portion 54A, and three U-shaped sides configuring the frame portion 54B.

The bezel member 54 has different attachment structures to the standing walls 19A and 19B and the display 16 between the first portion 54Aa and the second portions 54Ab and 54Ba.

First, in the first portion 54Aa, a rear surface 54a of the bezel member 54 adheres to an upper end surface 56 of the standing wall 19A with a first double-sided tape 60, and adheres to a front surface 37a of the display 16 with a second double-sided tape 61. The double-sided tapes 60 and 61 are provided to be aligned with a gap along the width direction (X direction in FIG. 6) of the bezel member 54. The bezel member 54 has a non-adhesive region 62 in the gap between the double-sided tapes 60 and 61.

The first double-sided tape 60 is a double-sided tape generally called for structural use, which generates a strong adhesive force particularly with respect to a structural material such as metal or resin. In the present embodiment, for example, a double-sided tape "3M VHB Y-4914" manufactured by 3M Company is used as the first double-sided tape 60. The standing walls 19A and 19B of the present embodiment are formed of, for example, an aluminum alloy. The first double-sided tape 60 is capable of generating a strong adhesive force with respect to the standing wall 19A made of such an aluminum alloy.

In particular, the standing wall 19A needs to secure a space for disposing the folded portion 40b of the display body 36 at the portion facing the first portion 54Aa, and has the upper end surface 56 whose width dimension is narrower than the other portions. For this reason, it is difficult for the first portion 54Aa of the bezel member 54 to sufficiently secure an adhesive area with respect to the upper end surface 56. Therefore, since a double-sided tape for a structure is used as the first double-sided tape 60, it is possible to secure a strong adhesive force even with respect to the upper end surface 56 having a small adhesive area, and it is possible to suppress peeling or lifting of the bezel member 54.

The second double-sided tape 61 is a double-sided tape that generates a strong adhesive force with respect to a low front surface energy material and is generally called for a low front surface energy material. As the low front surface energy material, for example, polypropylene (PP), polyethylene (PE), ethylene vinyl acetate (EVA), or the like is known. In the present embodiment, as the second double-sided tape 61, for example, a double-sided tape "TESA 61529" manufactured by TESA corporation was used. In the display 16 of the present embodiment, the front surface sheet 37 has the anti-fingerprint functional layer. That is, the front surface 37a of the display 16 is formed of the low front surface energy material with water repellency. Therefore, since a double-sided tape for a low front surface energy material is used as the second double-sided tape 61, it is possible to generate a strong adhesive force even with respect to the front surface 37a of the display 16 and it is possible to suppress peeling or lifting of the bezel member 54. At this time, the second double-sided tape 61 is adhesively fixed to the front surface 37a of the non-active region RI.

The non-adhesive region 62 is a portion where the double-sided tapes 60 and 61 are not provided and the rear surface 54a of the bezel member 54 is exposed. The non-adhesive region 62 is at a position vertically overlapping the folded portion 40b between the double-sided tapes 60 and 61. The non-adhesive region 62 is not provided with an adhesive material. Therefore, the non-adhesive region 62 does not adhere to the directly below folded portion 40b.

Next, in the second portions 54Ab and 54Ba, the rear surface 54a of the bezel member 54 adheres to the upper end surfaces 56 of the standing walls 19A and 19B and the front surface 37a of the display 16 by the third double-sided tape 64. The third double-sided tape 64 extends in substantially the entire width in the width direction (X direction in FIG. 7) of the bezel member 54, and extends from the upper end surface 56 to the front surface 37a.

It is preferable to use the double-sided tape for a low front surface energy material, which is the same type as the second double-sided tape 61, as the third double-sided tape 64.

That is, as illustrated in FIG. 7, the portions of the standing walls 19A and 19B that face the second portions 54Ab and 54Ba do not need to secure a space for disposing the folded portion 40b such as the portion of the standing walls 19A that faces the first portion 54Aa. Therefore, in the portions of the standing walls 19A and 19B that face the second portions 54Ab and 54Ba, it is possible to secure the width dimension of the upper end surface 56 that is larger than the width dimension in FIG. 6. Therefore, in the second portions 54Ab and 54Ba of the bezel member 54, it is possible to sufficiently secure an adhesive area with respect to the upper end surface 56. On the other hand, the bezel member 54 needs to be configured as narrow as possible from the viewpoint of improving the appearance quality. For this reason, the display 16 has a configuration in which the active region RA is enlarged to the maximum and the non-active region RI is narrow. Therefore, it is difficult for the third double-sided tape 64 to sufficiently secure an adhesive area with respect to the front surface 37a of the display 16.

Therefore, since the double-sided tape for a low front surface energy material is used as the third double-sided tape 64, it is possible to generate a strong adhesive force with respect to the display 16 having a small adhesive area, and it is possible to suppress peeling or lifting of the bezel member 54. On the other hand, since the upper end surfaces 56 of the standing walls 19A and 19B are made of, for example, an aluminum alloy, adhesion by the third double-sided tape 64, which is the double-sided tape for a low front surface energy material, is not optimal. However, in the upper end surface 56 in this case, it is possible to secure a large adhesive area as described above, so that it is possible to secure an enough adhesive force by the third double-sided tape 64 and it is possible to suppress peeling or lifting of the bezel member 54.

As the same as the first portion 54Aa illustrated in FIG. 6, the second portions 54Ab and 54Ba illustrated in FIG. 7 may have a configuration in which the bezel member 54 adheres to the upper end surface 56 with a structural double-sided tape and adheres to the front surface 37a with the double-sided tape for a low front surface energy material. However, as described above, in the second portion 54Ab and 54Ba, it is possible to secure sufficient adhesive strength only by the third double-sided tape 64, which is the double-sided tape for a low front surface energy material. Therefore, in the electronic apparatus 10, in order to reduce the cost by reducing the number of components, it is preferable to adhesively fix the second portions 54Ab and 54Ba by one third double-sided tape 64.

As described above, in the electronic apparatus 10 of the present embodiment, the bezel member 54 adheres to the standing wall 19A by the first double-sided tape 60 in the first portion 54Aa along one side 16a at which the folded portion 40b is provided in the display 16, adheres to the front surface 37a of the display 16 by the second double-sided tape 61, and is provided with the non-adhesive region 62 in a position that vertically overlaps the folded portion 40b between the double-sided tapes 60 and 61.

Therefore, the bezel member 54 has the non-adhesive region 62 that does not adhere to the folded portion 40b, which is a wire lead-out portion from the display 16, and, on the other hand, stably adheres to the upper end surface 56 of the standing wall 19A and the front surface 37a of the display 16 by the double-sided tapes 60 and 61. Therefore, in the electronic apparatus 10, for example, when the display 16 is removed for maintenance, even though the double-sided tapes 60 and 61 are peeled off and the bezel member 54 is peeled off, the folded portion 40b and the connecting portion 50 in the vicinity thereof are not destroyed. That is, in the electronic apparatus 10, the display 16 is not destroyed by peeling off the bezel member 54. As a result, in the electronic apparatus 10, it is possible to reuse the display 16 from which the bezel member 54 is removed after maintenance, so that maintainability is improved and component replacement costs are reduced.

In the electronic apparatus 10, the display 16 has the front surface sheet 37 that is laminated on the front surface 36a of the display body 36 and includes the anti-fingerprint functional layer. The first double-sided tape 60 is a double-sided tape for a structure, and the second double-sided tape 61 is a double-sided tape for a low front surface energy material. For this reason, in the bezel member 54, it is possible to secure a strong adhesive force with the first double-sided tape 60 for the structure with respect to the standing wall 19A on which it is not possible to secure a sufficient adhesive area to avoid the folded portion 40b. In addition, in the bezel member 54, it is possible to secure a strong adhesive force with respect to the front surface 37a that includes the anti-fingerprint functional layer by the second double-sided tape 61 for the low front surface energy material. As a result, the bezel member 54 is fixed to the standing wall 19A and the display 16 with high adhesive force while having a configuration in which the non-adhesive region 62 is provided in the first portion 54Aa, so that it is possible to suppress the occurrence of peeling or lifting.

In the electronic apparatus 10, the folded portion 40b is provided in the extended portion 40 which is an extension of a part of the non-active region RI of the display body 36 so as to wrap around the side portion of one side 16a to a back side. As a result, in the display 16, the most of the non-active region RI and the connecting portion 50 are disposed from the folded portion 40b to the side of the end portion 40a, and do not appear on the side of the front surface 37a. Therefore, in the electronic apparatus 10, it is possible to suppress the width dimension of the bezel member 54 fixed to the front surface 37a of the display 16, and it is possible to improve the appearance quality. Moreover, the bezel member 54 is fixed to the narrow front surface 37a. Since the double-sided tape for a low front surface energy material is used for the second double-sided tape 61, it is also possible to secure the adhesive strength.

As illustrated in FIG. 5, the bezel member 54 of the present embodiment may have a configuration in which the notch portion 54b is a part of the frame portion 54B and the lens plate 66 is attached so as to close the notch portion 54b.

Figure 8A:
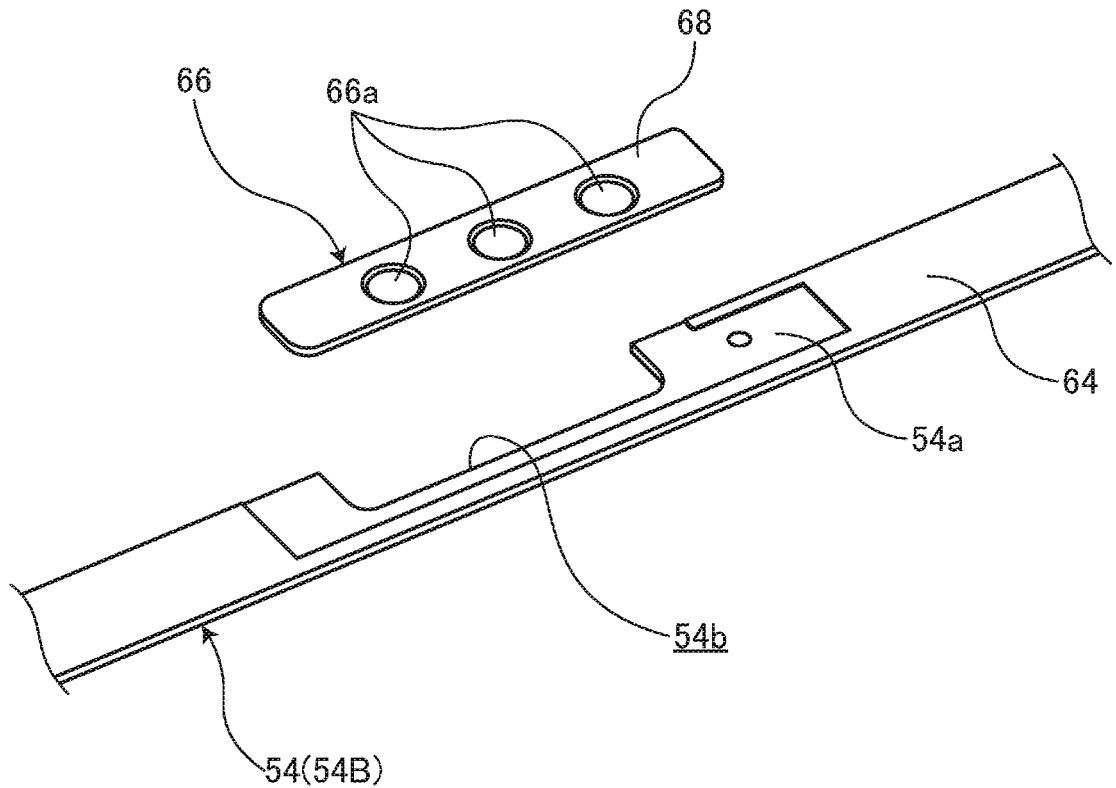
FIG. 8A is an enlarged exploded perspective view of a lens plate of the bezel member and a peripheral portion thereof.
Figure 8B:
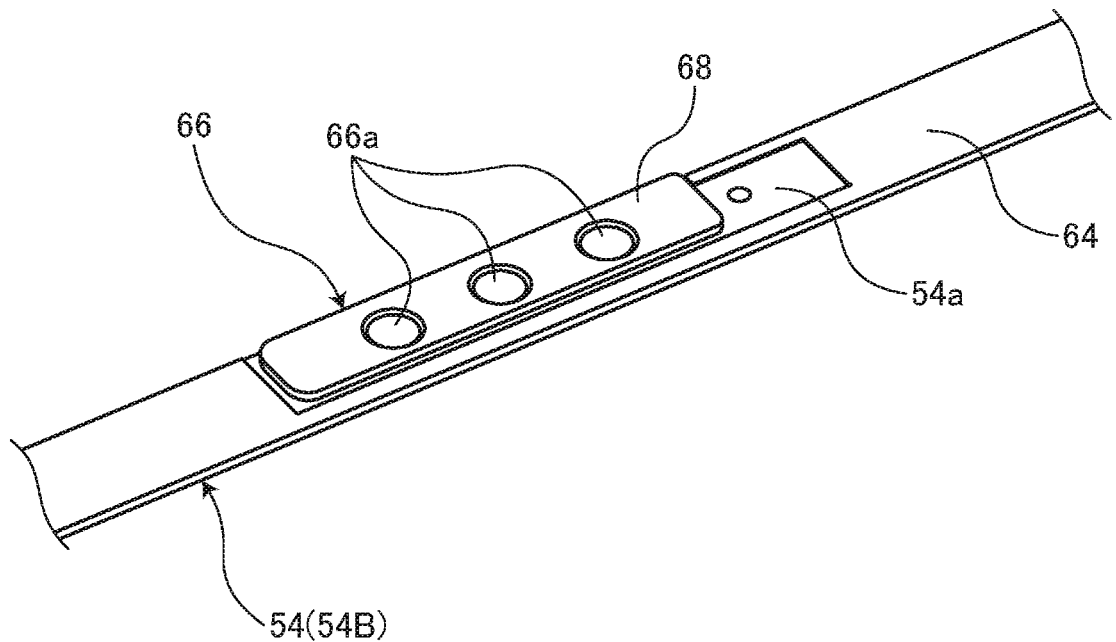
FIG. 8B is a perspective view of the lens plate illustrated in FIG. 8A in a state where the lens plate is fixed to the bezel member.
Figure 8C:
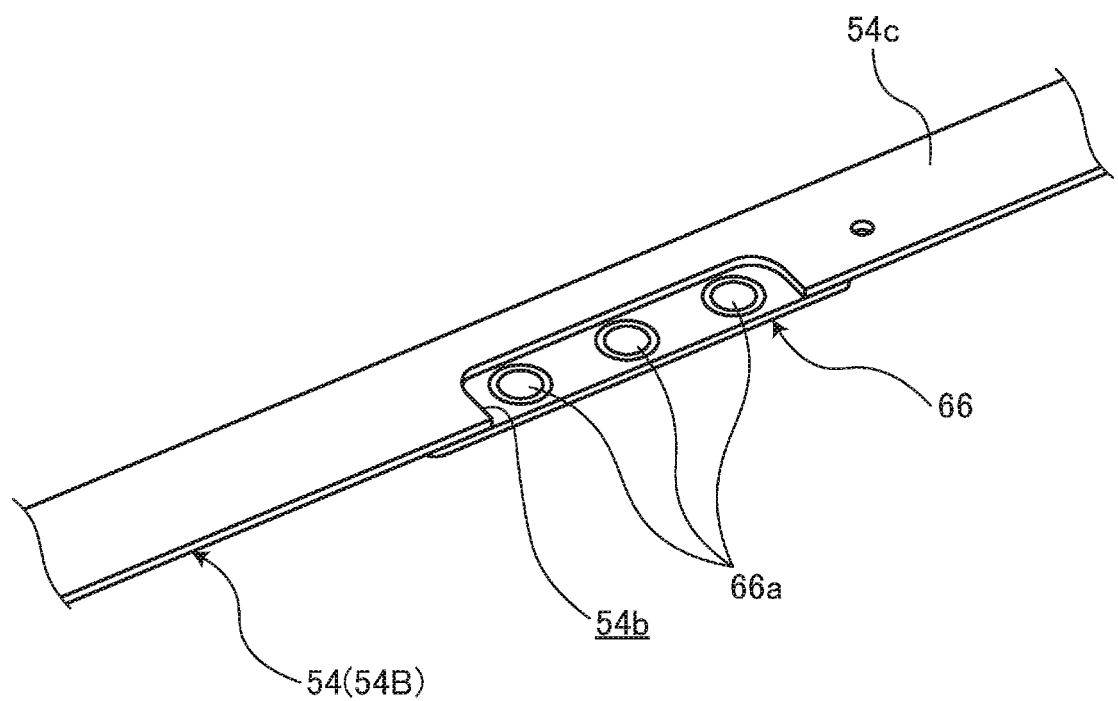
FIG. 8C is a perspective view of the lens plate illustrated in FIG. 8B and a peripheral portion thereof as viewed from a front surface side of the bezel member.

FIG. 8A is an enlarged exploded perspective view of the lens plate 66 of the bezel member 54 and the peripheral portion thereof. FIG. 8B is a perspective view of a state in which the lens plate 66 illustrated in FIG. 8A is fixed to the bezel member 54. FIG. 8C is a perspective view in which the lens plate 66 and the peripheral portion thereof illustrated in FIG. 8B are viewed from the side of the front surface 54c of the bezel member 54.

As illustrated in FIGS. 8A to 8C, the notch portion 54b is a portion in which a part of the bezel member 54 is notched in a recessed shape together with the third double-sided tape 64. The notch portion 54b has a shape in which the third double-sided tape 64 is notched one size larger than the bezel member 54. As a result, the peripheral edge portion of the notch portion 54b is not provided with the third double-sided tape 64, and the rear surface 54a of the bezel member 54 is exposed.

The lens plate 66 is, for example, a glass plate formed by aligning three camera lenses 66a. The number of installed camera lenses 66a may be changed. The lens plate 66 is fixed to the rear surface 54a exposed at the peripheral edge portion of the notch portion 54b using an adhesive material such as a double-sided tape. As a result, the lens plate 66 closes the notch portion 54b and the camera lens 66a is exposed to the front surface 54c of the bezel member 54 through the notch portion 54b (see FIG. 8C).

On the rear surface of the lens plate 66, the double-sided tape 68 is provided in addition to a portion where the camera lens 66a is formed. The double-sided tape 68 is the same type as the third double-sided tape 64. As a result, in the bezel member 54, the third double-sided tape 64 cut off at the notch portion 54b is complemented by the double-sided tape 68 of the lens plate 66. For this reason, it is possible to suppress peeling or lifting of the bezel member 54 at a portion to which the lens plate 66 is attached.

As illustrated in FIG. 5, in the third double-sided tape 64 of the present embodiment, a pair of tape notch portions 69 may be provided at a part of a portion attached to the frame portion 54A, and each tape notch portion 69 may be closed by a sheet-shaped member 70. The tape notch portion 69 is obtained by cutting a part of the third double-sided tape 64 attached to the pair of second portions 54Ab of the frame portion 54A along the X direction.

Figure 9A:
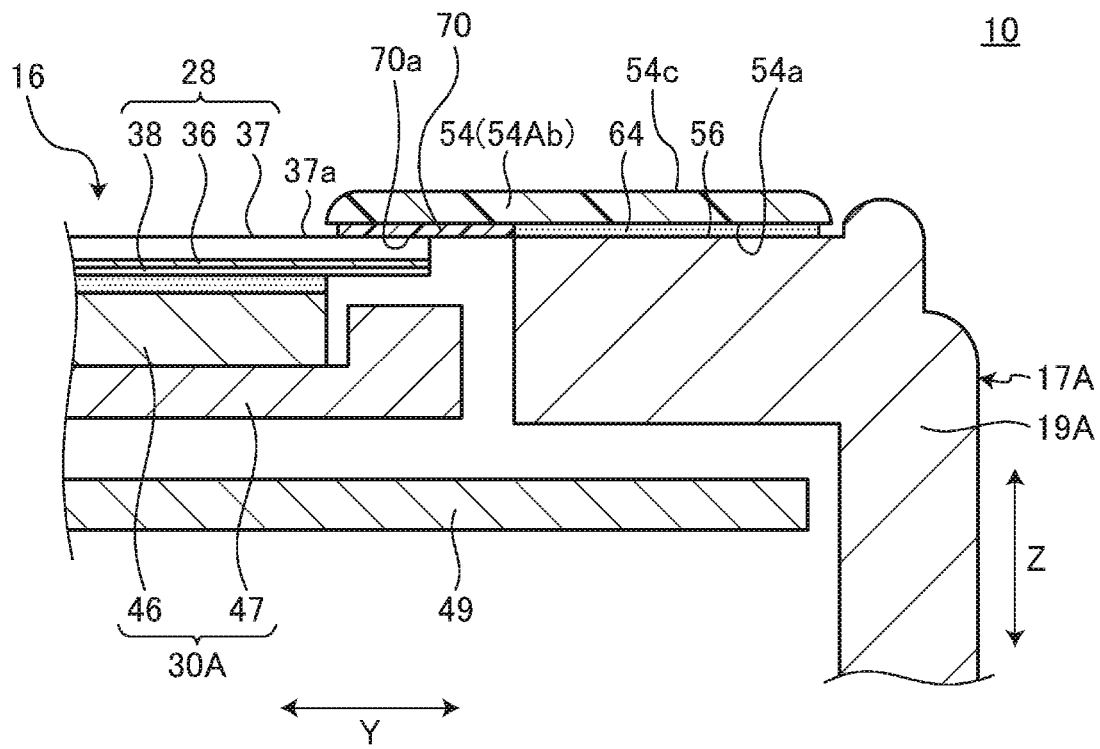
FIG. 9A is a schematic cross-sectional view along line IX-IX in FIG. 5.
Figure 9B:
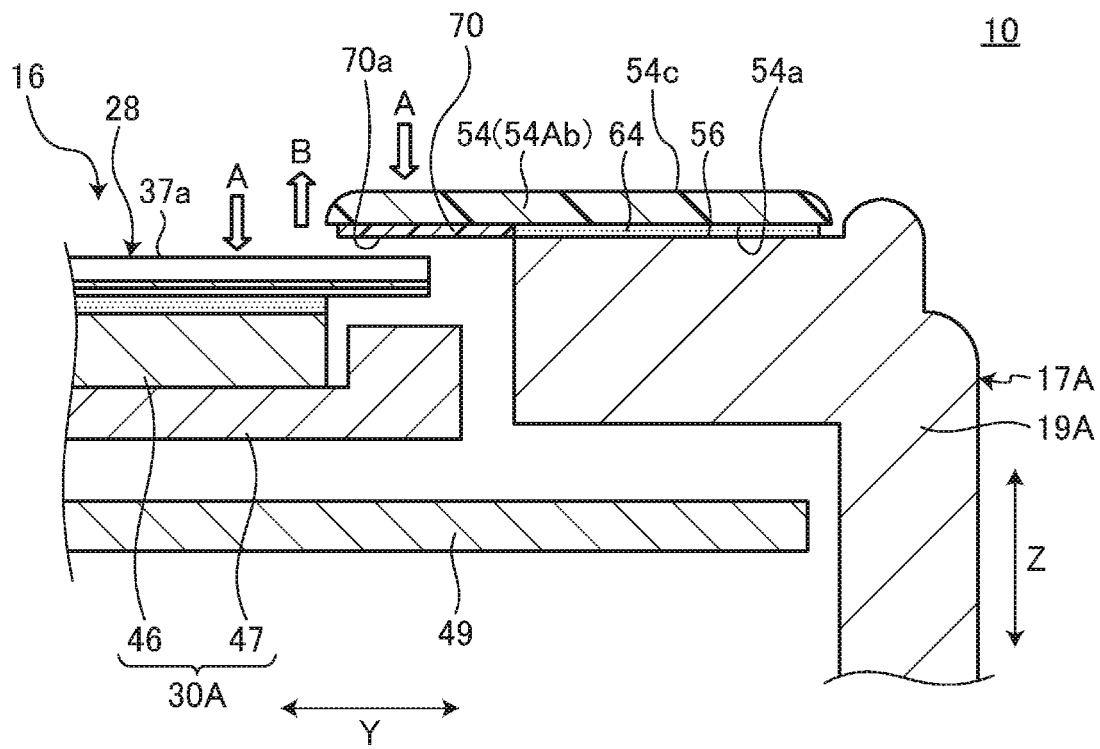
FIG. 9B is a schematic cross-sectional view illustrating a state in which the display is pressed downward from a state illustrated in FIG. 9A.

FIG. 9A is a schematic cross-sectional view along line IX-IX in FIG. 5. FIG. 9B is a schematic cross-sectional view illustrating a state in which the display 16 is pressed downward from a state illustrated in FIG. 9A.

As illustrated in FIGS. 5 and 9A, the tape notch portion 69 is a portion in which a part of the third double-sided tape 64 is notched in a recessed shape. In the bezel member 54, the rear surface 54a is exposed at a portion where the tape notch portion 69 is provided.

The sheet-shaped member 70 is a sheet such as a resin or a sponge having substantially the same thickness as the third double-sided tape 64. The sheet-shaped member 70 is disposed so as to fill the tape notch portion 69, and is fixed to the rear surface 54a of the bezel member 54 exposed to the tape notch portion 69 with an adhesive material such as a double-sided tape. The sheet-shaped member 70 has a contact surface 70a that is disposed substantially flush with the adhesive surface of the third double-sided tape 64 with respect to the front surface 37a and the upper end surface 56, and that comes into contact with the front surface 37a of the display 16. The adhesive material is not provided on the contact surface 70a.

Here, as illustrated in FIG. 3, the first plate 30A supporting the display 16 is in a state of floating from the first chassis member 12A without the fastening portion 44 around a portion where the sheet-shaped member 70 is provided. Specifically, the sheet-shaped member 70 on one side in the Y direction in FIG. 3 is at a position largely separated from the closest left and right fastening portions 44a and 44b. Similarly, the sheet-shaped member 70 on the other side in the Y direction in FIG. 3 is also at a position largely separated from the closest left and right fastening portions 44c and 44d. The reason for this is that, between the fastening portions 44a and 44b and between the fastening portions 44c and 44d, it is difficult to add the fastening portion 44 to the first plate due to the relationship with electronic components or the like disposed on the bottom surface side thereof, and it is also difficult to support the first chassis member 12A with anything other than the fastening portion 44.

Therefore, when the user presses the portion provided with the sheet-shaped member 70 from above with a fingertip or the like, the display 16 sinks downward by receiving the pressing force illustrated by an arrow A in FIG. 9B, and, accordingly, the bezel member 54 also sinks slightly downward at first. However, the bezel member 54, has a bottom surface more than half of which is attached to the upper end surface 56, and has some rigidity. For this reason, the bezel member 54 tends to return to the original position as soon as the bezel member 54 sinks downward. At that time, a force (force B in FIG. 9B) for the bezel member 54 to return to the original position exceeds the adhesive force between the bezel member 54 and the display 16, and the adhesive material of the third double-sided tape 64 is forcibly removed from the display 16, so that there is a possibility that an unpleasant peeling sound such as water splashing is produced. Therefore, the electronic apparatus 10 is provided with the sheet-shaped member 70 that does not have the adhesive material on the contact surface 70a at a portion where the sinking of the display 16 is expected, thereby preventing such a peeling sound.

Figure 10:
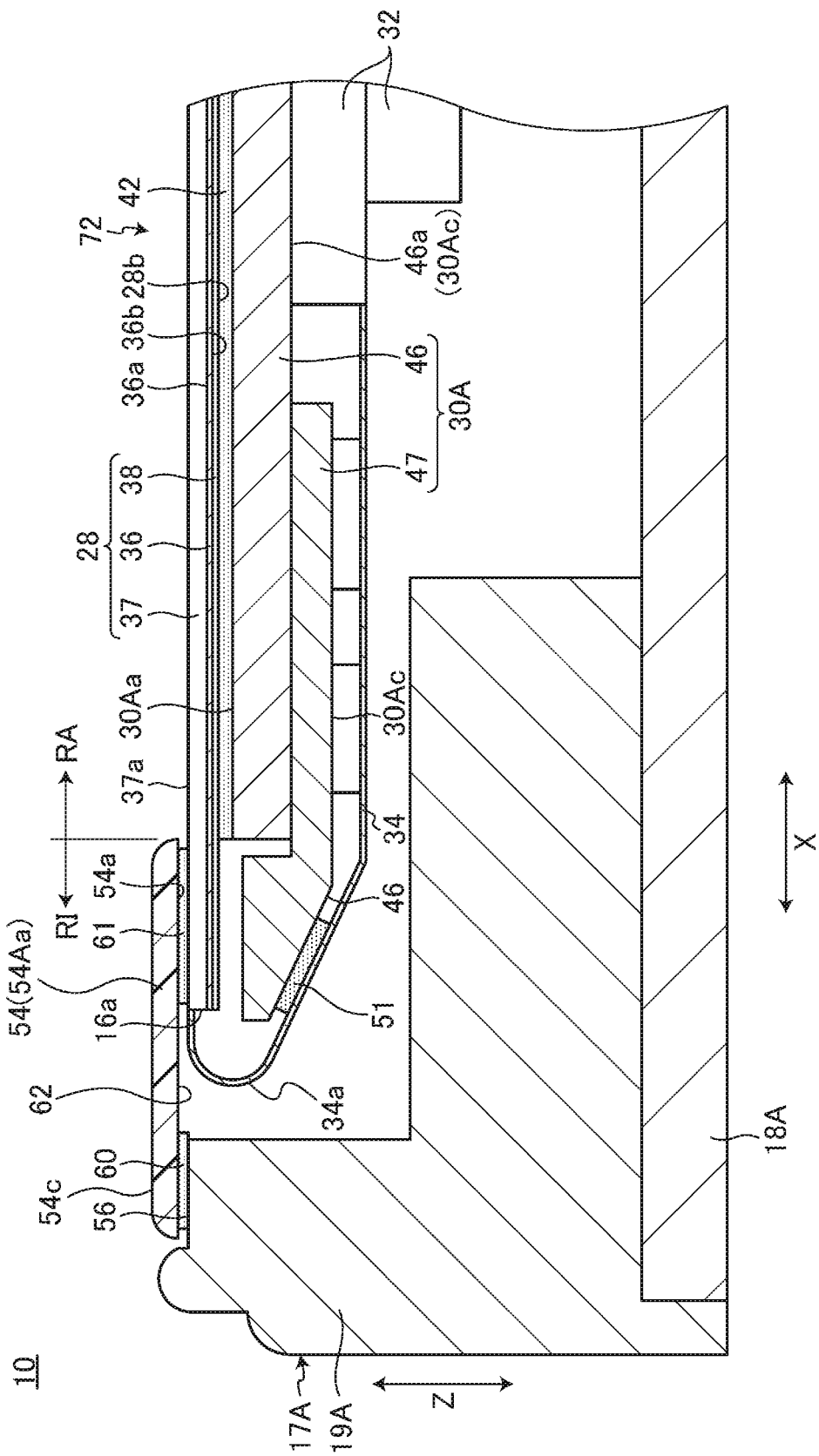
FIG. 10 is a schematic side cross-sectional view of a part along one side of an electronic apparatus including a display according to a modification example, and a peripheral portion thereof.

FIG. 10 is a schematic side cross-sectional view of a part along one side 16a of the electronic apparatus 10 including a display 72 according to a modification example, and a peripheral portion thereof. In FIG. 10, since the same reference numerals as the reference numerals illustrated in FIG. 6 indicate the same or similar configurations, the same or similar functions and effects are achieved, and detailed description thereof will be omitted.

The display 72 illustrated in FIG. 10 is different from the display 16 described above in a point that the extended portion 40 and the folded portion 40b are not provided in the display body 36, and the folded portion 34a is provided on the flexible board 34, instead of the folded portion 40b. That is, each flexible board 34 has a first end portion that is connected to the display body 36 at one side 16a, and a second end portion that is connected to the control board 32 via a folded portion 34a which is folded back in an arc shape.

Even in the configuration example illustrated in FIG. 10, the non-adhesive region 62 of a bezel member 54 is at a position that vertically overlaps the folded portion 34a of each flexible board 34. Therefore, even in the electronic apparatus 10 having the configuration, for example, when the display 16 is removed for maintenance, it is possible to suppress the destruction of the connecting portions of the folded portion 34a and the flexible board 34 with the display body 36 even when the double-sided tapes 60 and 61 are peeled off and the bezel member 54 is peeled off.

The present invention is not limited to the above-described embodiments, and modification is freely possible without departing from the gist of the present invention.

In the above description, the electronic apparatus 10 having a configuration in which the left and right chassis members 12A and 12B are relatively rotatably connected by the hinge device 14 and which has the display 16 having the bending region R3 is illustrated. However, it is also possible to use the attachment structure between the bezel member 54, the display 16, the chassis member 12A, and the like for, for example, the display chassis of a laptop PC, an external display device connected to a desktop PC, and the like.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF SYMBOLS 10 electronic apparatus
12A first chassis member
12B second chassis member
14 hinge device
16, 72 display
19A, 19B standing wall
28 display laminate
32 control board
34 flexible board
34a, 40b folded portion
36 display body
54 bezel member
60 first double-sided tape
61 second double-sided tape
62 non-adhesive region
64 third double-sided tape
66 lens plate
70 sheet-shaped member

What is claimed is:
1. An electronic apparatus comprising:
a chassis member that has a standing wall;
a display that is supported by the chassis member and has an outer peripheral edge portion surrounded by the standing wall;
a control board that is connected to the display and controls display of the display; and a bezel member that is provided so as to straddle between the standing wall and the display, and is adhesively fixed to front surfaces of the standing wall and the display, wherein a folded portion is provided between the display and the control board and is folded back to a back side of the display so as to wrap around one side of the outer peripheral edge portion of the display, in a portion along the one side provided with the folded portion, the bezel member
- adheres to the standing wall with a first double-sided tape,
- adheres to the front surface of the display with a second double-sided tape, and
- is provided with a non-adhesive region at a position vertically overlapping the folded portion between the first double-sided tape and the second double-sided tape, the display includes:
- a display body that includes an active region and a non-active region; and
- a front surface sheet that is laminated on a front surface of the display body and includes an anti-fingerprint functional layer, the second double-sided tape adheres the bezel member to the anti-fingerprint function layer, and the bezel member adheres to the front surfaces of the standing wall and the display with a third double-sided tape extending from the standing wall to the front surface in a portion other than the portion along the one side provided with the folded portion.

2. The electronic apparatus according to claim 1, wherein the first double-sided tape is a double-sided tape for a structure, and
the second double-sided tape is a double-sided tape for a low front surface energy material.

3. The electronic apparatus according to claim 2, wherein the display body is formed in a flexible sheet shape, and has an extended portion that is an extension of a part of the non-active region, and
the folded portion is formed in the extended portion.

4. The electronic apparatus according to claim 2, further comprising:
a flexible board that has a first end portion connected to the display body and a second end portion connected to the control board, wherein
the folded portion is formed in the flexible board.

5. The electronic apparatus according to claim 1, wherein the third double-sided tape is a double-sided tape for a low front surface energy material.

6. The electronic apparatus according to claim 5, wherein the chassis member has a first chassis member, and a second chassis member that is adjacent to the first chassis member,
the electronic apparatus further includes a hinge device that relatively rotatably connects the first chassis member and the second chassis member between a first posture in which the first chassis member and the second chassis member are laminated so as to overlap each other in a surface normal direction and a second posture in which the first chassis member and the second chassis member are aligned to each other in a direction perpendicular to the surface normal direction,
the display extends over the first chassis member and the second chassis member, and
the folded portion is provided, in the outer peripheral edge portion of the display, on a side other than a side along the direction in which the first chassis member and the second chassis member are aligned.

7. The electronic apparatus according to claim 1, further comprising:
a lens plate a part of which a camera lens is formed, wherein
the bezel member has a notch portion in which a part of the portion provided with the third double-sided tape is notched together with the third double-sided tape,
the camera lens is exposed to a front surface of the bezel member through the notch portion, and
the lens plate is provided with a double-sided tape of the same type as the third double-sided tape on a rear surface other than a portion where the camera lens is formed.

8. The electronic apparatus according to claim 1, wherein the third double-sided tape has a tape notch portion a part of which is notched,
the electronic apparatus further includes a sheet-shaped member that is fixed to the bezel member so as to fill a portion in which the tape notch portion is formed, and
the sheet-shaped member is not provided with an adhesive material on a contact surface with respect to the front surface of the display.

* * * * *